United States Patent
Choi et al.

(10) Patent No.: US 9,758,869 B2
(45) Date of Patent: Sep. 12, 2017

(54) ANODIZED SHOWERHEAD

(75) Inventors: Soo Young Choi, Fremont, CA (US);
Suhail Anwar, San Jose, CA (US);
Gaku Furuta, Sunnyvale, CA (US);
Beom Soo Park, San Jose, CA (US);
Robin L Tiner, Santa Cruz, CA (US);
John M White, Hayward, CA (US);
Shinichi Kurita, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 1430 days.

(21) Appl. No.: 12/779,167

(22) Filed: May 13, 2010

(65) Prior Publication Data

US 2010/0288197 A1    Nov. 18, 2010

Related U.S. Application Data

(60) Provisional application No. 61/178,030, filed on May 13, 2009.

(51) Int. Cl.
*C23C 16/00* (2006.01)
*H01J 37/00* (2006.01)
(Continued)

(52) U.S. Cl.
CPC .... *C23C 16/45565* (2013.01); *C23C 16/4404* (2013.01); *C23C 16/5096* (2013.01);
(Continued)

(58) Field of Classification Search
USPC .... 156/345.33–345.34, 915, 345.51–345.54, 156/914; 118/720–721
See application file for complete search history.

(56) References Cited

U.S. PATENT DOCUMENTS 5,180,467 A * 1/1993 Cook et al. ............... 156/345.34
5,959,828 A * 9/1999 Lewis et al. ............... 361/215
(Continued)

FOREIGN PATENT DOCUMENTS

CN        1752281 A      3/2006
JP     2004-285479      10/2004
(Continued)

OTHER PUBLICATIONS

International Search Report and Written Opinion dated Dec. 15, 2010 for International Application No. PCT/US2010/034806.
(Continued)

*Primary Examiner* — Gordon R Baldwin
*Assistant Examiner* — Charlee Bennett
(74) *Attorney, Agent, or Firm* — Patterson + Sheridan LLP

(57) ABSTRACT

Embodiments disclosed herein generally relate to an apparatus having an anodized gas distribution showerhead. In large area, parallel plate RF processing chambers, mastering the RF return path can be challenging. Arcing is a frequent problem encountered in RF processing chambers. To reduce arcing in RF processing chambers, straps may be coupled to the susceptor to shorten the RF return path, a ceramic or insulating or anodized shadow frame may be coupled to the susceptor during processing, and an anodized coating may be deposited onto the edge of the showerhead that is nearest the chamber walls. The anodized coating may reduce arcing between the showerhead and the chamber walls and therefore enhance film properties and increase deposition rate.

23 Claims, 16 Drawing Sheets

(51) Int. Cl.
  *C23C 16/455* (2006.01)
  *C23C 16/44* (2006.01)
  *C23C 16/509* (2006.01)
  *H01J 37/32* (2006.01)

(52) U.S. Cl.
  CPC .. *H01J 37/32091* (2013.01); *H01J 37/32449* (2013.01); *H01J 37/32541* (2013.01); *H01J 37/32559* (2013.01); *H01J 37/32577* (2013.01)

(56) References Cited

U.S. PATENT DOCUMENTS

| | | | | |
|---|---|---|---|---|
| 6,041,733 | A * | 3/2000 | Kim et al. | 118/723 E |
| 6,050,216 | A * | 4/2000 | Szapucki et al. | 156/345.34 |
| 6,086,677 | A * | 7/2000 | Umotoy et al. | 118/715 |
| 6,827,815 | B2 * | 12/2004 | Hytros et al. | 156/345.33 |
| 7,255,898 | B2 | 8/2007 | O'Donnell et al. | |
| 7,605,086 | B2 | 10/2009 | O'Donnell et al. | |
| 7,641,761 | B2 | 1/2010 | Tsuji et al. | |
| 2002/0069968 | A1 * | 6/2002 | Keller et al. | 156/345.33 |
| 2002/0162507 | A1 * | 11/2002 | Shang | 118/723 R |
| 2004/0129211 | A1 * | 7/2004 | Blonigan et al. | 118/715 |
| 2006/0024517 | A1 * | 2/2006 | Doan et al. | 428/469 |
| 2006/0060302 | A1 * | 3/2006 | White et al. | 156/345.28 |
| 2008/0274297 | A1 | 11/2008 | Furuta et al. | |

FOREIGN PATENT DOCUMENTS

| | | |
|---|---|---|
| JP | 2005-209771 A | 8/2005 |
| JP | 2006-104575 A | 4/2006 |
| JP | 2007-201406 A | 8/2007 |
| KR | 10-2004-0084226 | 10/2004 |
| KR | 10-0654005 B1 | 11/2006 |
| KR | 654005 B1 * | 12/2006 |
| KR | 10-2007-0036844 | 4/2007 |

OTHER PUBLICATIONS

Merriam-Webster's Collegiate Dictionary; Eleventh Edition; 3 pages; Oct. 2012.
Official letter dated Dec. 20, 2013 from China patent office for corresponding Chinese patent application No. 201080026164.1.
Japanese Office Action (with English translation) for Application No. 2012-511028 dated Aug. 12, 2014; 9 total pages.
Korean Office Action dated Jan. 20, 2016 for Application No. 10-2011-7029814.

* cited by examiner

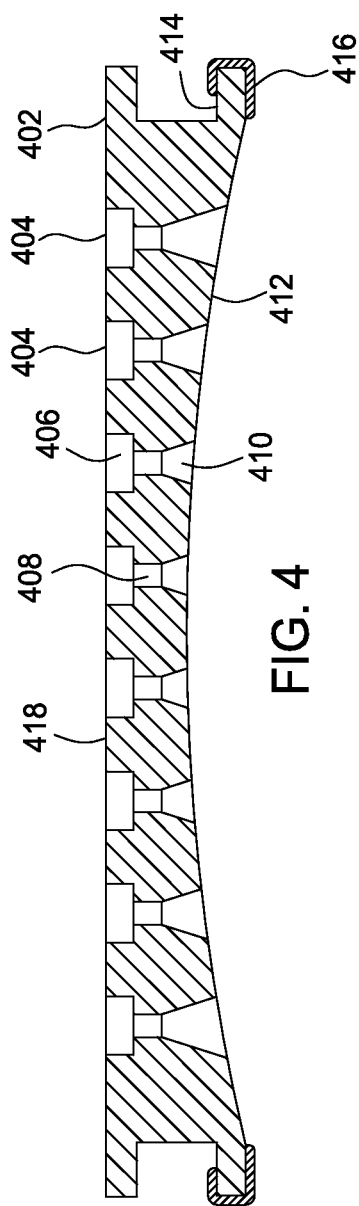
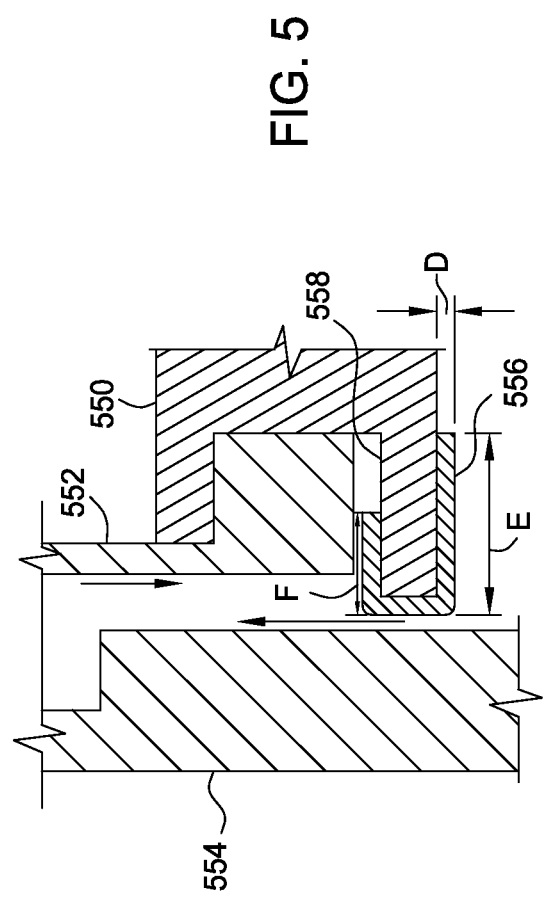

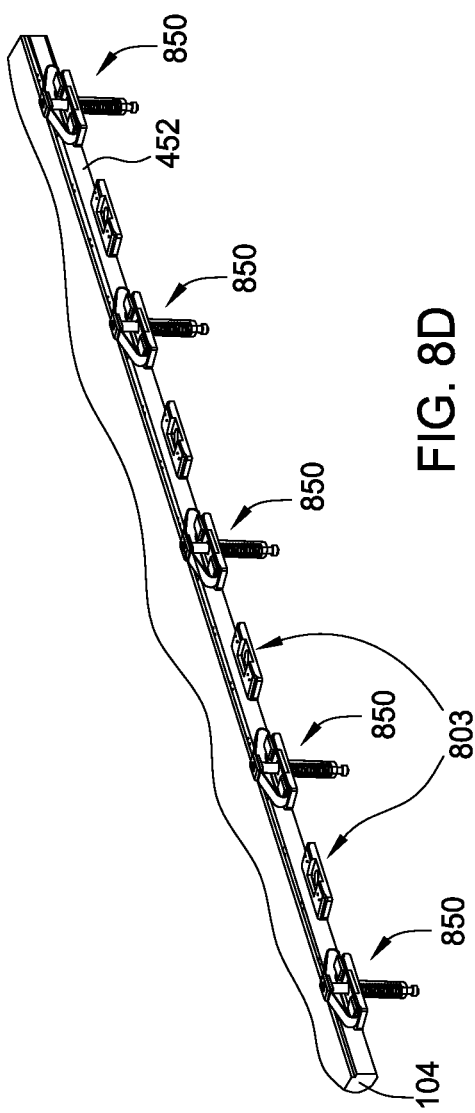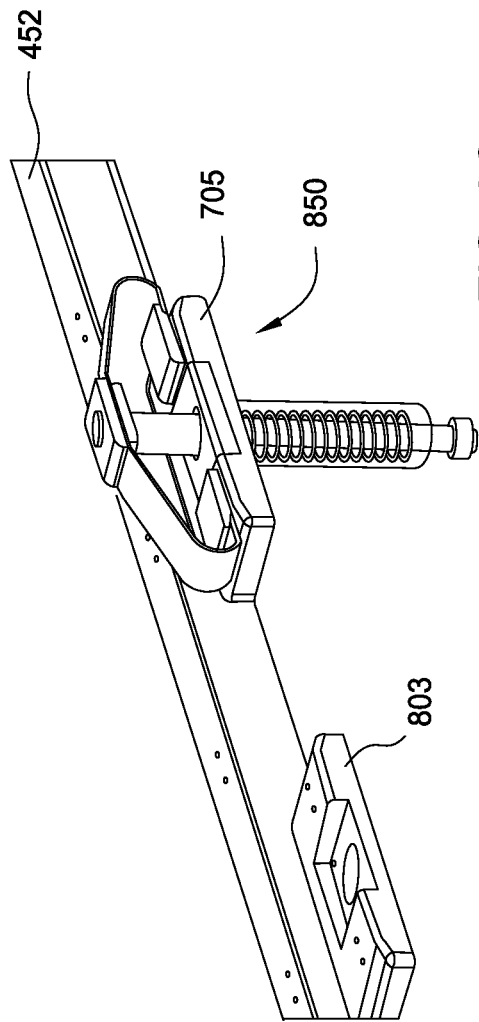

ANODIZED SHOWERHEAD

CROSS-REFERENCE TO RELATED APPLICATIONS

This application claims benefit of U.S. Provisional Patent Application Ser. No. 61/178,030 (APPM/14406L), filed May 13, 2009, which is herein incorporated by reference.

BACKGROUND OF THE INVENTION

Field of the Invention

Embodiments disclosed herein generally relate to an apparatus having an anodized gas distribution showerhead.

Description of the Related Art

Plasma enhanced chemical vapor deposition (PECVD) is generally employed to deposit thin films on substrates, such as semiconductor substrates, solar panel substrates, flat panel display (FPD) substrates, organic light emitting display (OLED) substrates, and others. PECVD is generally accomplished by introducing a processing gas into a vacuum chamber having a substrate disposed on a susceptor. The processing gas is energized into a plasma by applying an RF current to the chamber from one or more RF sources coupled to the chamber. The plasma reacts to form a layer of material on a surface of the substrate that is positioned on the susceptor.

RF current seeks to return to the source driving it. Thus, the RF current needs a path to return to the RF power source. When the RF return path is not properly laid out, the RF current returning to the RF power source will likely have a lower potential than the RF current traveling in the chamber to ignite the processing gas into a plasma. If the two currents get close enough, the potential difference between the two currents may cause arcing in the chamber and potentially ignite a parasitic plasma that could affect deposition uniformity and film properties during deposition.

Therefore, there is a need in the art for an apparatus having a properly designed RF return path.

SUMMARY OF THE INVENTION

Embodiments disclosed herein generally relate to an apparatus having an anodized gas distribution showerhead. In large area, parallel plate RF processing chambers, mastering the RF return path can be challenging. Arcing is a frequent problem encountered in RF processing chambers. To reduce arcing in RF processing chambers, straps may be coupled to the susceptor to shorten the RF return path, a ceramic or insulating or anodized shadow frame may be coupled to the susceptor during processing, and an anodized coating may be deposited onto the edge of the showerhead that is nearest the chamber walls. The anodized coating may reduce arcing between the showerhead and the chamber walls and therefore enhance film properties and increase deposition rate.

In one embodiment, a plasma processing apparatus is disclosed. The apparatus includes a processing chamber body having walls and a floor, a susceptor disposed in the processing chamber body and movable between a first position and a second position and one or more straps coupled to the susceptor and to one or more of the floor or walls. The apparatus also includes a showerhead disposed in the processing chamber body opposite to the susceptor and having one or more gas passages extending therethrough. The showerhead includes an anodized coating, disposed over portions of the showerhead that are adjacent the walls. The apparatus also includes a shadow frame disposed in the processing chamber body between the susceptor and the showerhead, the shadow frame movable between a third position spaced from the susceptor and a fourth position in contact with the susceptor.

In another embodiment, a gas distribution showerhead is disclosed. The showerhead includes a showerhead body having a plurality of gas passages extending therethrough. The showerhead body has a central portion and a flange portion. The flange portion has a first surface that faces a susceptor during processing, a second surface opposite the first surface and an edge surface connecting the first and second surfaces. The showerhead also includes an anodized coating disposed over the flange portion of the showerhead body. The anodized coating covers at least part of the edge surface. The anodized coating extends from a first location that is a first distance from a center of the showerhead body. The anodized coating extends from a second location that is a second distance from the center of the showerhead body that is greater than the first distance. The anodized coating extends from both the first location and the second location to anodized coating covering at least part of the edge surface.

In another embodiment, a plasma enhanced chemical vapor deposition apparatus is disclosed. The apparatus includes a chamber body having a plurality of walls and a chamber floor and a susceptor disposed in the chamber body and movable between a first position spaced a first distance from the chamber floor and a second position spaced a second distance greater than the first distance from the chamber floor. The apparatus also includes a plurality of straps coupled to the susceptor and to one or more of the chamber floor and the plurality of walls. The plurality of straps are unevenly distributed along the susceptor. The apparatus also includes a gas distribution showerhead disposed in the chamber body opposite the susceptor, having a plurality of gas passages extending therethrough and having a central portion and an edge portion. The gas distribution showerhead includes an anodized coating disposed over the showerhead and extending above the surface of the gas distribution showerhead. The anodized coating has a thickness over the edge portion that is greater than a thickness over the central portion.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 is a schematic cross sectional view of a gas distribution showerhead 402 according to one embodiment.

FIG. 5 is a schematic cross sectional view of a gas distribution showerhead 550 relative to a process chamber wall 554 according to one embodiment.

FIGS. 8C and 8D are isometric views of one embodiment of a bracket.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to an apparatus having an anodized gas distribution showerhead. In large area, parallel plate RF processing chambers, mastering the RF return path can be challenging. Arcing is a frequent problem encountered in RF processing chambers. To reduce arcing in RF processing chambers, straps may be coupled to the susceptor to shorten the RF return path, a ceramic or insulating or anodized shadow frame may be coupled to the susceptor during processing, and an anodized coating may be deposited onto the edge of the showerhead that is nearest the chamber walls. The anodized coating may reduce arcing between the showerhead and the chamber walls and therefore enhance film properties and increase deposition rate.

The embodiments discussed herein will make reference to a large area PECVD chamber manufactured and sold by AKT America, a subsidiary of Applied Materials, Inc., Santa Clara, Calif. It is to be understood that the embodiments discussed herein may be practiced in other chambers as well, including chambers sold by other manufacturers. Large area processing chambers are sized to process substrates having an area of greater than about fifteen thousand square centimeters. In one embodiment, the substrates may have an area of greater than about fifty thousand square centimeters. In another embodiment, the substrates may have an area of greater than about fifty five thousand square centimeters. In another embodiment, the substrates may have an area of greater than about sixty thousand square centimeters. In another embodiment, the substrates may have an area of greater than about ninety thousand square centimeters.

Figure 1:
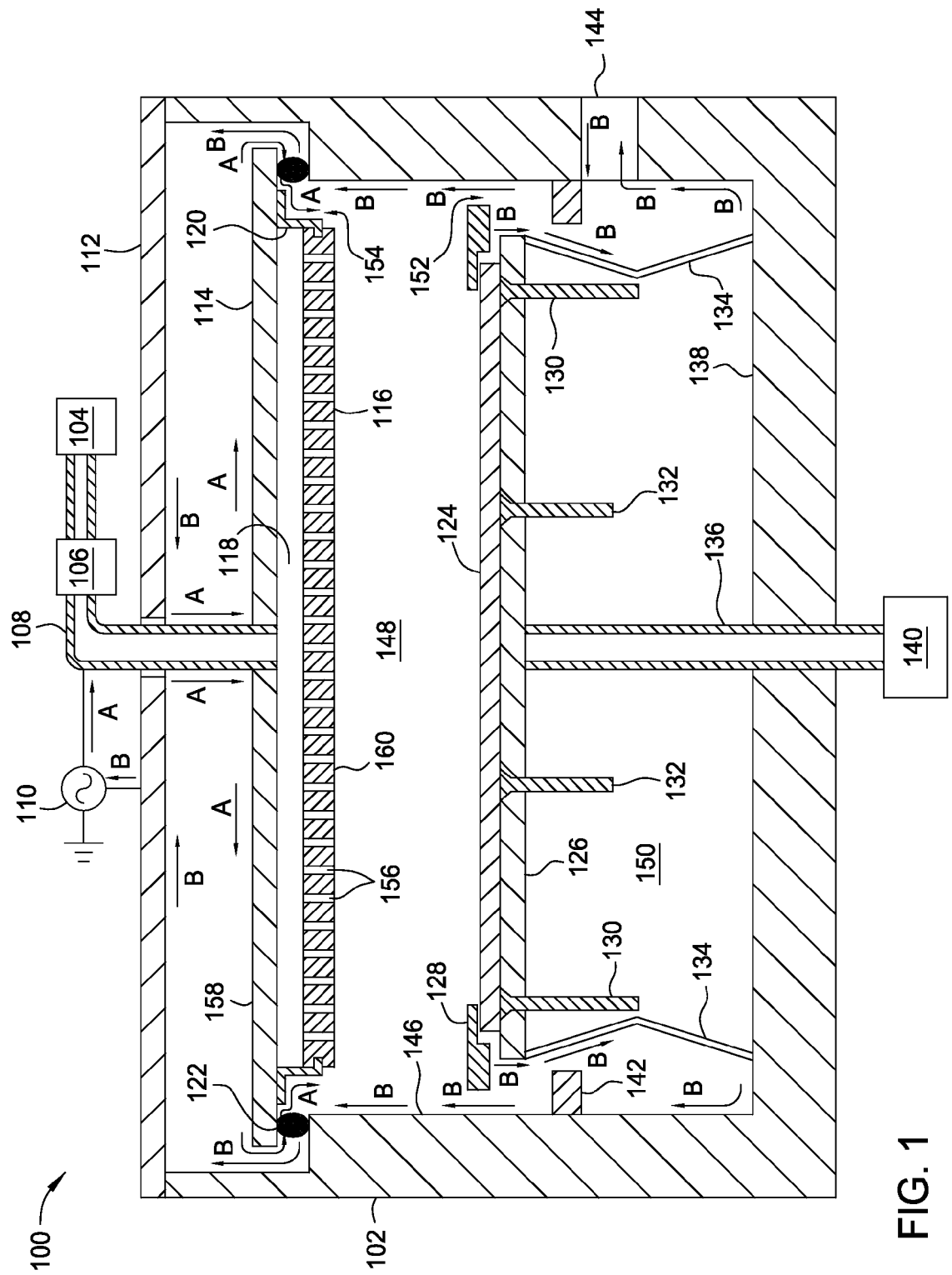
FIG. 1 is a schematic cross sectional view of an apparatus 100 according to one embodiment.

FIG. 1 is a schematic cross sectional view of an apparatus 100 according to one embodiment. In the embodiment shown, the apparatus 100 is a PECVD apparatus. The apparatus 100 includes a chamber body 102 into which is fed processing gas from a gas source 104. When the apparatus 100 is used for deposition, the processing gas is fed from the gas source, through a remote plasma source 106 and through a tube 108. The processing gas is not ignited into a plasma in the remote plasma source 106. During cleaning, the cleaning gas is sent from the gas source 104 into the remote plasma source 106 where it is ignited into a plasma before entering the chamber. The tube 108 is an electrically conductive tube 108.

The RF current that is used to ignite the processing gas into a plasma within the chamber is coupled to the tube 108 from a RF power source 110. RF current travels along the outside of the tube 108 due to the 'skin effect' of RF current. RF current will penetrate only a certain, predeterminable depth into a conductive material. Thus, the RF current travels along the outside of the tube 108 and the processing gas travels within the tube 108. The processing gas never 'sees' the RF current when it is traveling in the tube 108 because the RF current does not penetrate far enough into the tube 108 to expose the processing gas to RF current when it is within the tube 108.

The processing gas is fed to the chamber through the backing plate 114. The processing gas then expands into an area 118 between the backing plate 114 and the showerhead 116. The processing gas then travels through gas passages 156 and into the processing area 148.

The RF current, on the other hand, does not enter the area 118 between the backing plate 114 and the showerhead 116. Instead, the RF current travels along the outside of the tube 108 to the backing plate 114. There, the RF current travels along the atmospheric side 158 of the backing plate 114. The backing plate 114 may comprise a conductive material. In one embodiment, the backing plate 114 may comprise aluminum. In another embodiment, the backing plate 114 may comprise stainless steel. The RF current then travels from the backing plate along a bracket 120 that comprises a conductive material. In one embodiment, the bracket 120 may comprise aluminum. In another embodiment, the bracket 120 may comprise stainless steel. The RF current then travels along the front face 160 of the showerhead 116 where it ignites the processing gas that has passed through the gas passages 156 into a plasma in the processing area 148 located between the showerhead 116 and the substrate 124. The path that the RF current travels to reach the front face 160 of the showerhead 116 is shown by arrows "A". In one embodiment, the showerhead 116 may comprise a conductive material. In another embodiment, the showerhead 116 may comprise a metal. In another embodiment, the showerhead 116 may comprise aluminum. In another embodiment, the showerhead 116 may comprise stainless steel.

Due to the plasma, material is deposited onto the substrate 124. The substrate may be disposed on a susceptor 126 that is movable between a first position spaced a first distance from the showerhead 116 and a second position spaced a second distance from the showerhead 116 where the second distance is less than the first distance. The susceptor 126 may be disposed on a stem 136 and be moved by an actuator 140.

The substrate 124 is a large area substrate and hence, may bow when elevated on lift pins 130, 132. Thus, the lift pins 130, 132 may have different lengths. When the substrate 124 is inserted into the chamber through the slit valve opening 144, the susceptor 126 may be in a lowered position. When the susceptor 126 is in a lowered position, the lift pins 130, 132 may extend above the susceptor 126. Thus, the substrate 124 is placed on the lift pins initially. The lift pins 130, 132 have different lengths. The outer lift pins 130 are longer than the inner lift pins 132 so that the substrate 124 sags in the center when placed on the lift pins 130, 132. The susceptor 126 is raised to meet the substrate 124. The substrate 124 contacts the susceptor 126 in a center to edge progression so that any gas that is present between the susceptor 126 and the substrate 124 is expelled. The lift pins 130, 132 and then raised by the susceptor 126 along with the substrate 124.

When the susceptor 126 is raised above the slit valve opening 144, the susceptor 126 encounters a shadow frame 128. The shadow frame 128, when not in use, rests on a ledge 142 positioned above the slit valve opening 144. The shadow frame 128, because it is so large, may not align properly. Therefore, rollers may be present on either the shadow frame 128 or the susceptor 126 to permit the shadow frame 128 to roll into proper alignment on the susceptor 126. The shadow frame 128 serves a dual purpose. The shadow frame 128 shields areas of the susceptor 126 that are not covered by a substrate 124 from deposition. Additionally, the shadow frame 128, when it comprises an electrically insulating material, may electrically shield the RF current that travels along the susceptor 126 from the RF current that travels along the walls 146. In one embodiment, the shadow frame 128 may comprise an insulating material. In another embodiment, the shadow frame 128 may comprise a ceramic material. In another embodiment, the shadow frame 128 may comprise $Al_2O_3$. In another embodiment, the shadow frame may comprise a metal with an anodized layer thereover. In one embodiment, the metal comprises aluminum. In another embodiment, the anodized layer comprises $Al_2O_3$.

The RF current needs to return to the power source 110 that drives it. The RF current couples through the plasma to the susceptor 126. In one embodiment, the susceptor 126 may comprise a conductive material such as aluminum. In another embodiment, the susceptor 126 may comprise a conductive material such as stainless steel. The RF current travels back to the power source 110 by traveling the path shown by arrows "B".

To shorten the RF current return path, one or more straps 134 may be coupled to the susceptor 126. By utilizing straps 134, the RF current will travel down the straps to the bottom 138 of the chamber and then back up the walls 146 of the chamber. As will be discussed below, RF return path elements may be coupled between the susceptor and the shadow frame ledge 142 as well to shorten the RF current return path. In the absence of the straps 134, the RF current would travel along the bottom of the susceptor 126, down the stem 136 and then back along the bottom 138 and walls 146 of the chamber. A high potential difference may exist between the RF current travelling along the bottom of the susceptor 126 and the RF current on either the stem 136 or the bottom 138 of the chamber. Because of the potential different, arcing may occur in the area 150 below the susceptor. The straps 134 reduce the likelihood of arcing in area 150.

Arcing may also occur in area 152 between the wall 146 and the susceptor. The shadow frame 128, when it is an insulating material, may reduce any arcing that may occur in area 152. The additional RF return elements that will be discussed below may also aid in reducing arcing in area 152. The RF current returns back along the wall 146 and the lid 112 before reaching the power source 110. An O-ring 122 electrically isolates the wall 146 from the backing plate 114. Arcing may occur between the showerhead 116 and the wall 146 in area 154 to the high potential difference. To reducing arcing in area 154, the showerhead 116 may anodized near the wall 146.

Figure 2:
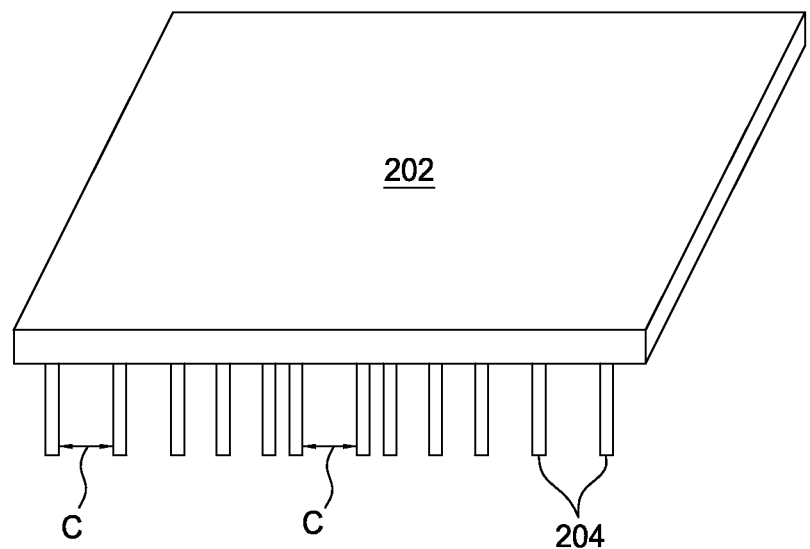
FIG. 2 is an isometric view of a susceptor 202 having a plurality of straps 204 coupled thereto according to one embodiment.

FIG. 2 is an isometric view of a susceptor 202 having a plurality of straps 204 coupled thereto according to one embodiment. In the embodiment shown in FIG. 2, the straps 204 are asymmetrically spaced along the susceptor 202 such that there are more straps closer to the center of the susceptor 202 as opposed to the corners of the susceptor. In other words, the spacing between the straps 204 as shown by arrows "C" is greater near the corner of the susceptor 202 as opposed to the center of the susceptor.

Figure 3:
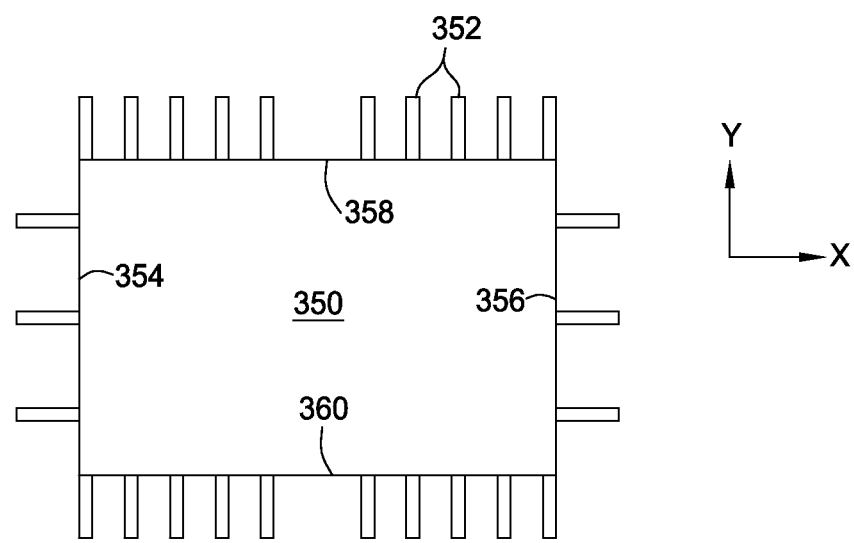
FIG. 3 is a schematic top view of a susceptor 350 having a plurality of straps 352 coupled thereto according to another embodiment.

FIG. 3 is a schematic top view of a susceptor 350 having a plurality of straps 352 coupled thereto according to another embodiment. The straps are symmetrically arranged about the "X" axis, but asymmetrically arranged about the "Y" axis. Sides 358 and 360 are adjacent chamber walls that are substantially identical. Side 354 is adjacent the slit valve opening. The RF current travels back along the walls to reach the RF power source. Thus, the RF current has a longer path when it travels along the wall having the slit valve opening. Therefore, side 354 has a different strap 352 arrangement. Similarly, side 356 is shorter than sides 358 and 360 due to the rectangular shape of the chamber and thus is arranged differently than sides 358 and 360. Because no slit valve opening is adjacent side 356, the strap 352 arrangement for side 356 is different than for side 354.

Figure 11:
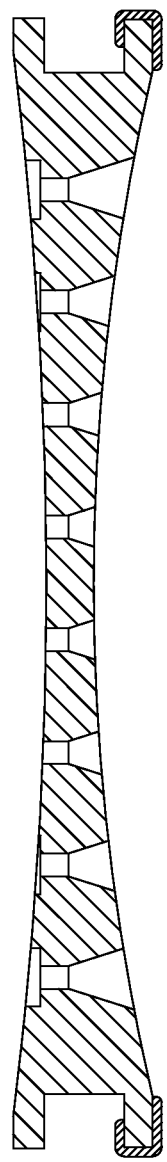
FIG. 11 is a schematic cross sectional view of a gas distribution showerhead according to another embodiment.

FIG. 4 is a schematic cross sectional view of a gas distribution showerhead 402 according to one embodiment. The showerhead 402 has a plurality of gas passages 404 passing between the upstream side 418 that faces the backing plate and the downstream side 412. The downstream side 412 is shown to be concave facing the substrate. It is to be understood that the downstream side 412 may be flat and substantially parallel to the upstream side 418 in some embodiments. In one embodiment, the upstream side 418 of the showerhead 402 may be concave as well as shown in FIG. 11. The gas passages 404 have a plenum 404, an orifice 408 and a hollow cathode cavity 410. The plenum 404 is present due to the drilling that is used to form the gas passages 404. The orifice 408 generates a back pressure on the upstream side 418 of the showerhead 418. Due to the back pressure, the gas may evenly distribute on the upstream side 418 of the showerhead 402 before passing through the gas passages 404. The hollow cathode cavities 410 permit a plasma to be generated within the gas passages 404 in the hollow cathode cavities 410. The hollow cathode cavities 410 permit greater control of plasma distribution within the processing chamber as opposed to the situation where no hollow cathode cavities are present. The hollow cathode cavities 410 at the downstream side 412 have a larger diameter or width than the orifices 408. The orifice 408 has a width or diameter less than the plasma dark space and thus, plasma is not expected to light above the hollow cathode cavities 410.

The showerhead 402 also has a flange 414 that extends out towards the chamber walls. The flange 414 is distinguished from the center. The flange 414, because it will be close to the processing chamber, is a location where arcing may occur. The difference in the RF potential between the flange 414 and the wall may be great enough to permit arcing to occur between the showerhead 402 and the chamber wall. To prevent arcing, an anodized layer 416 may be formed over the flange 414, but not over the center.

To form the anodized layer 416 over the flange 414, the showerhead may be first formed by drilling the gas passages 404 therethrough. The downstream side 412 may be made concave either before or after the drilling. In any event, after the showerhead 402 is formed, it is quite dirty and needs to be cleaned. In some embodiments, the showerhead 402 may be cleaned. Following the cleaning, the showerhead 402 may be anodized. In one embodiment, to obtain the anodized layer 416 after the cleaning, the entire showerhead 402 is anodized to form an anodized layer over the entire showerhead 402. Then, the flange 414 where the anodized layer 416 is to remain is masked. Thereafter, the unmasked portions of the showerhead 402 are de-anodized. The mask is then removed to leave the flange 414 covered in an anodized layer 416 and the remainder of the showerhead 402 not anodized. An alternative manner of making the showerhead is to clean the entire showerhead and then anodize only the flange 414. In one embodiment, the anodized layer 416 may comprise an insulating layer. In another embodiment, the anodized layer 416 may comprise $Al_2O_3$. In another embodiment, the anodized layer 416 may comprise a ceramic material. In another embodiment, the anodized layer may comprise $SiO_2$. In another embodiment, the anodized layer 416 may comprise polytetrafluoroethylene. In another embodiment, the anodized layer 416 may comprise an organic material.

FIG. 5 is a schematic cross sectional view of a gas distribution showerhead 550 relative to a process chamber wall 554 according to one embodiment. As shown in FIG. 5, the flange 558 of the showerhead 550 extends close to the wall 554. The showerhead 550 is suspended from the backing plate by a flange 552. Due to the proximity of the flange 558 to the wall 554, arcing may occur between the wall 554 and the flange 558 because of the RF potential difference. The anodized layer 556 that is deposited over the flange 558 acts as an insulation to add impedance and slow down the RF current traveling along the showerhead 550. The anodized layer 556 may prevent electrons from jumping from the high RF potential of the showerhead 550 to the low RF potential of the wall 554. The anodized layer 556 may be thin enough to permit the RF current to continue along the showerhead 550. However, the presence of the anodized layer 556 will be thick enough to prevent or reduce arcing between the showerhead 550 and the wall 554. The anodized layer 556 may be thin enough to prevent cracking thereof. In one embodiment, the anodized layer 556 may have a thickness of between about 20 microns to about 90 microns as shown by arrows "ID". In another embodiment, the anodized layer 556 may have a thickness of between about 50 microns to about 63 microns as shown by arrows "ID". In one embodiment, the anodized layer 556 will extend along the flange 558 on the side facing the substrate for a distance of between about 0.70 microns to about 0.90 microns as shown by arrows "E". In one embodiment, the anodized layer 556 will extend along the flange 558 on the side facing away from the substrate for a distance of between about 0.40 microns to about 0.60 microns as shown by arrows "F". In one embodiment, the anodized layer 556 will extend along the surface of the flange 558 that faces the substrate for a distance that is greater than the distance that the anodized layer 556 extends along the flange on the surface that faces away from the substrate.

By having an anodized layer over a portion of the showerhead in addition to an anodized or ceramic shadow frame, higher RF power levels may be used as compared to not using an anodized layer and anodized or ceramic shadow frame. In one embodiment, the power levels used may be 20 percent higher than normal or more. The use of a higher power level permits an increase in the deposition rate and enhances the film properties of the deposited film. For example, rather than a power lever of 30 kW, a power level of close to 40 kW may be used without fear of arcing within the processing chamber.

Figure 6:
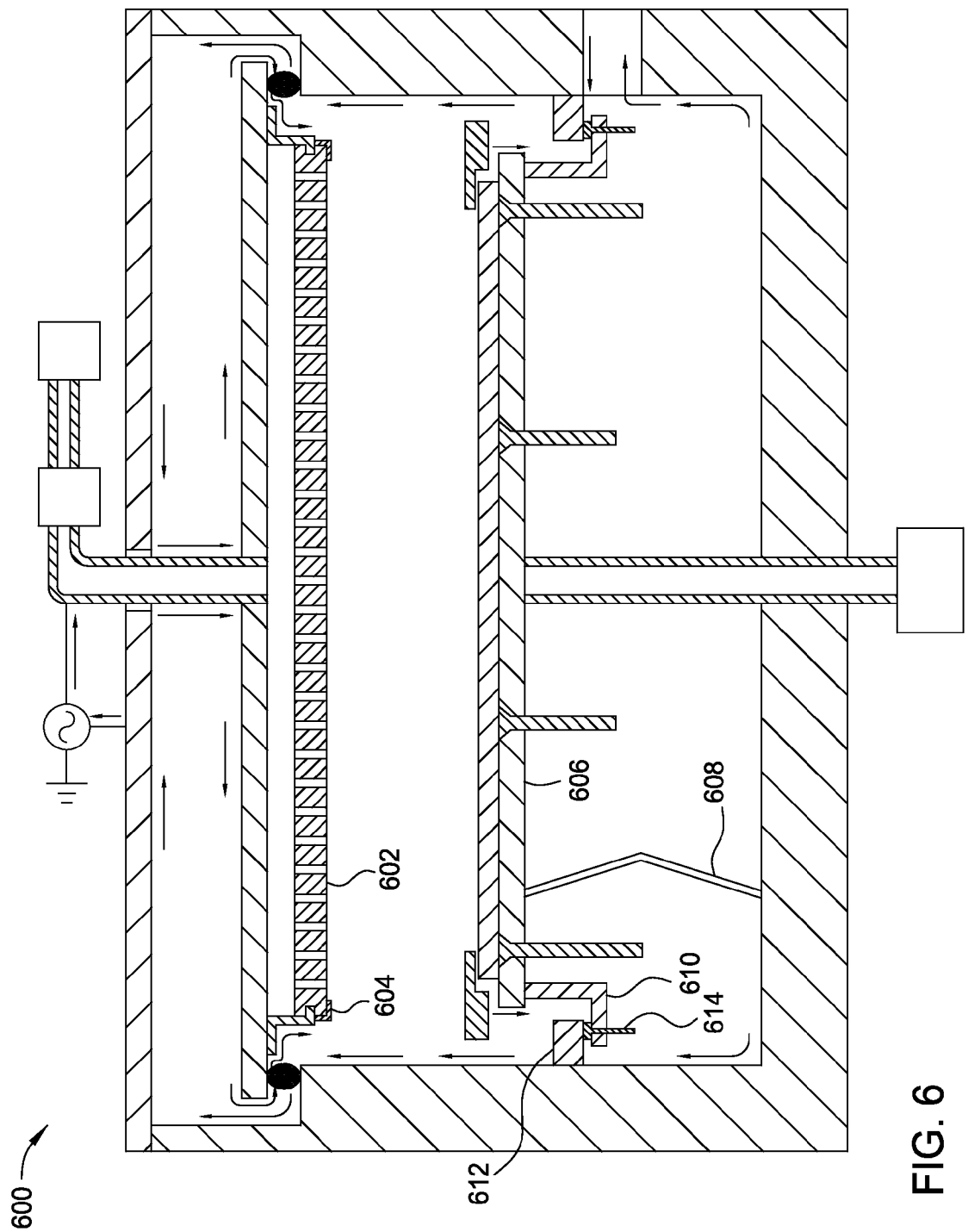
FIG. 6 is a schematic cross sectional view of an apparatus 600 containing an anodized layer 604 on the showerhead 602 according to another embodiment.

FIG. 6 is a schematic cross sectional view of an apparatus 600 containing an anodized layer 604 on the showerhead 602 according to another embodiment. The susceptor 606 has not only the straps 608 coupled to the susceptor 606, but also an RF return element 614 by way of an extension 610 coupled to the bottom of the susceptor 606. The RF return element 614 couples to the ledge 612 which supports the shadow frame 616 when the susceptor 606 is in the lowered position. The RF return element 614 shown in FIG. 6 is a rod that provides the electrical connection between the susceptor 606 and the ledge 612. The RF return element 614 provides a shorter return path than the straps 608 and thus, the majority of the RF current will return to the RF power source by way of the RF return elements 614 rather than the straps 608. Other RF return elements may also be used in conjunction with the anodized layer 604 and the straps 608, which will be discussed below. In one embodiment, the RF return element 614 may be disposed on the ledge 612 and extend therebelow until the extension 610 from the susceptor 606 moves into contact with the RF return element 614.

Figure 7A:
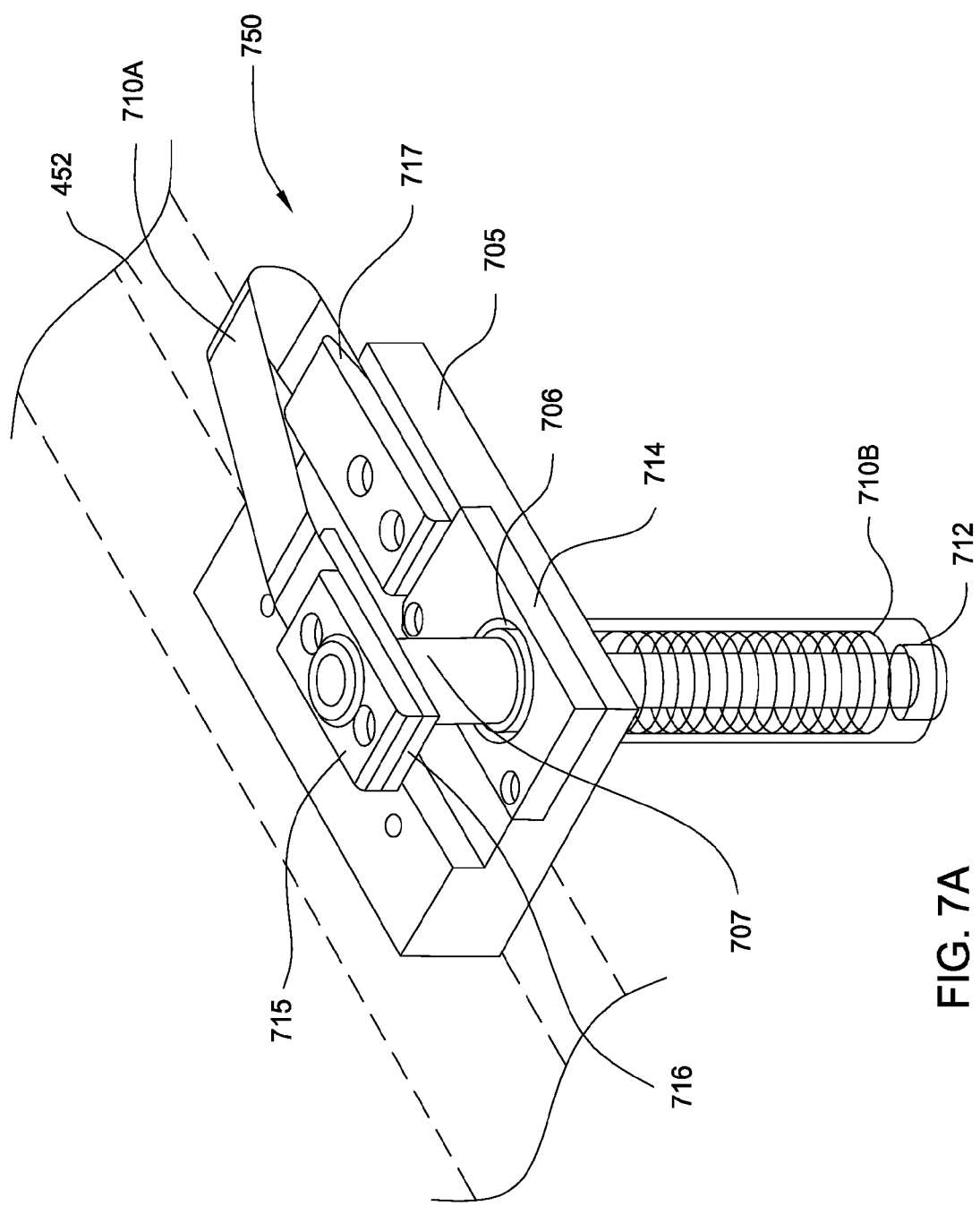
FIG. 7A is an isometric view of another embodiment of a RF return device.
Figure 7B:
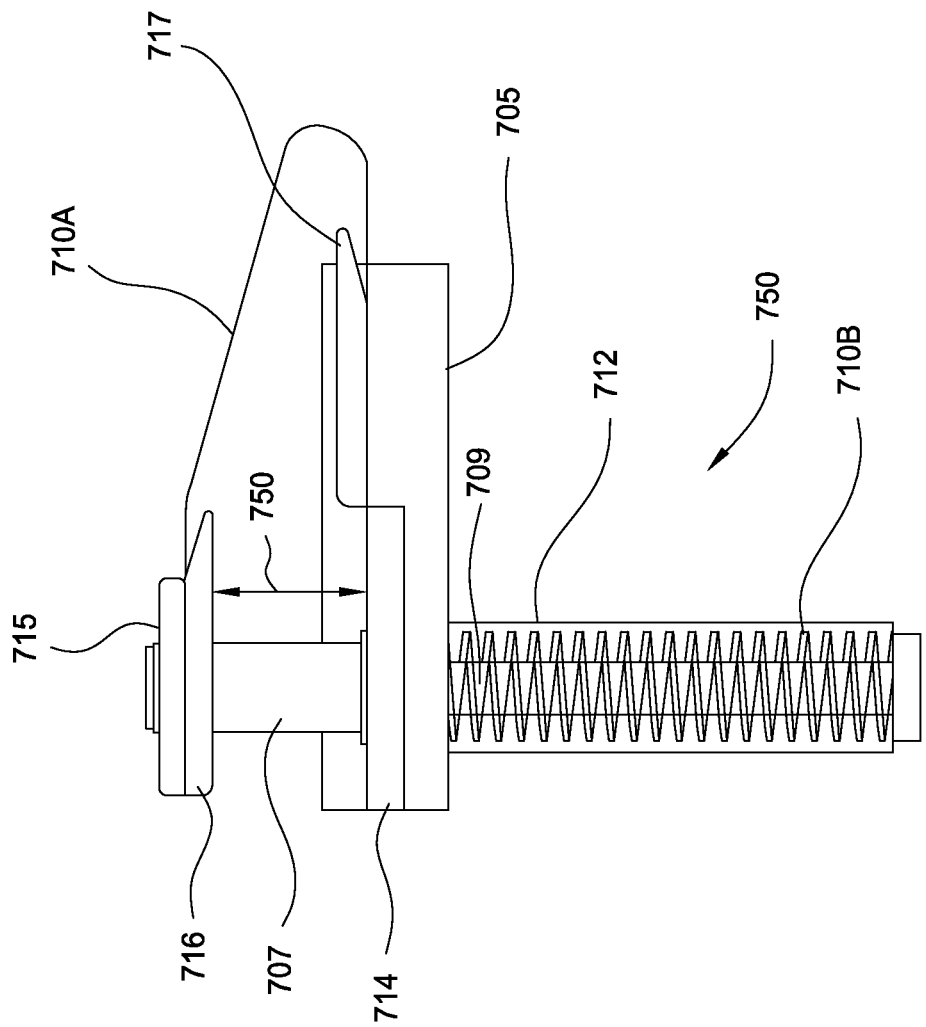
FIG. 7B is a side view of the RF return device shown in FIG. 7A.

FIGS. 7A and 7B are isometric and side views, respectively, of one embodiment of a RF return devices depicted as a compressible contact member 750. In this embodiment, the compressible contact member 750 is mounted on a base 705 that may be coupled to a bracket 452 (shown in phantom) or be an integral portion of the bracket 452 that, in turn, would be coupled to a substrate support. In one embodiment, the base 705 includes an opening 706 adapted to receive a shaft 707. The shaft 707 is movably disposed through the opening 706 to provide relative movement between the base 705 and the shaft 707.

The compressible contact member 750 includes at least one elastic portion, shown in this embodiment as elastic spring forms 710A and 710B. Spring forms 710A, 710B provide elasticity to the compressible contact member 750 while spring form 710A additionally provides a conductive path for electrical current. In one embodiment, the spring form 710B is coupled to a tubular member 712 having a mounting portion 714 that houses the spring form 710B and provides a mounting interface to couple with the base 705.

Referring to FIGS. 7A and 7B, spring forms 710A, 710B may be a flexible material made with conductive or insulating materials having properties that carry or conduct an electrical current. In one embodiment, the flexible material includes sheet material, such as sheet metal or foil, a cable or wire, and combinations thereof, or other elastic member or material. The spring forms 710A, 710B are exposed to the processing environment in the plasma chambers and the flexible materials are chosen to survive and operate in the extremes encountered in the processing environments. In one embodiment, the flexible material for the spring forms 710A, 710B includes any elastic metal or metal alloy that substantially retains flexible properties, such as mechanical integrity and/or elastic properties, during processing. In one aspect, the flexible material for the spring forms 710A, 710B include any elastic metal or metal alloy that substantially retains elasticity when the flexible material reaches temperatures above 200 degrees Celsius. In this embodiment, the flexible property of the material retained at the temperature above 200 degrees Celsius is substantially similar to the flexible property of the material at ambient temperature.

In some embodiments, the flexible material may be in the form of a leaf spring, a coil spring, a compression spring or other flexible device or form. In one embodiment, the spring forms 710A, 710B comprise a metallic material or metallic alloy, which may additionally be coated, wrapped or clad with a conductive material. Examples of metals and metal alloys include nickel, stainless steel, titanium, MONEL®, beryllium copper, or other conductive elastic materials. Examples of conductive materials for the coating, wrapping or cladding include aluminum, anodized aluminum, or other coating, film, or sheet material. In one embodiment, the spring form 710A comprises a nickel or titanium alloy sheet material that is wrapped or covered with aluminum foil. In one embodiment, the spring form 710B comprises a MONEL® 400 material.

The compressible contact member 750 includes a contact pad 715 coupled to a head portion 716 of the shaft 707. A first end of the spring form 710A is coupled to and in electrical communication with the contact pad 715 and in one embodiment is sandwiched between the head portion 716 and the contact pad 715. Fasteners, such as bolts or screws may be used to couple the contact pad 715 to the head portion 716. The second end of the spring form 710A is coupled to and in electrical communication with the base 705 by pad cap 717 which, in one embodiment, sandwiches the spring form 710A to the base 705. Fasteners, such as bolts or screws may be used to couple the contact pad cap 717 to the base 705.

The base 705, pad 715, pad cap 717, shaft 707 and tubular member 712 may be made of a conductive material and additionally may be coated or wrapped with a conductive material. Examples of conductive material include aluminum, anodized aluminum, nickel, titanium, stainless steel, alloys thereof or combinations thereof. In one embodiment, the pad 715, pad cap 717, shaft 707 and tubular member 712 are made of an anodized aluminum material or a conductive material such as nickel, titanium, stainless steel, alloys thereof or combinations thereof, and coated, wrapped or clad with a conductive material, such as aluminum.

Figure 7C:
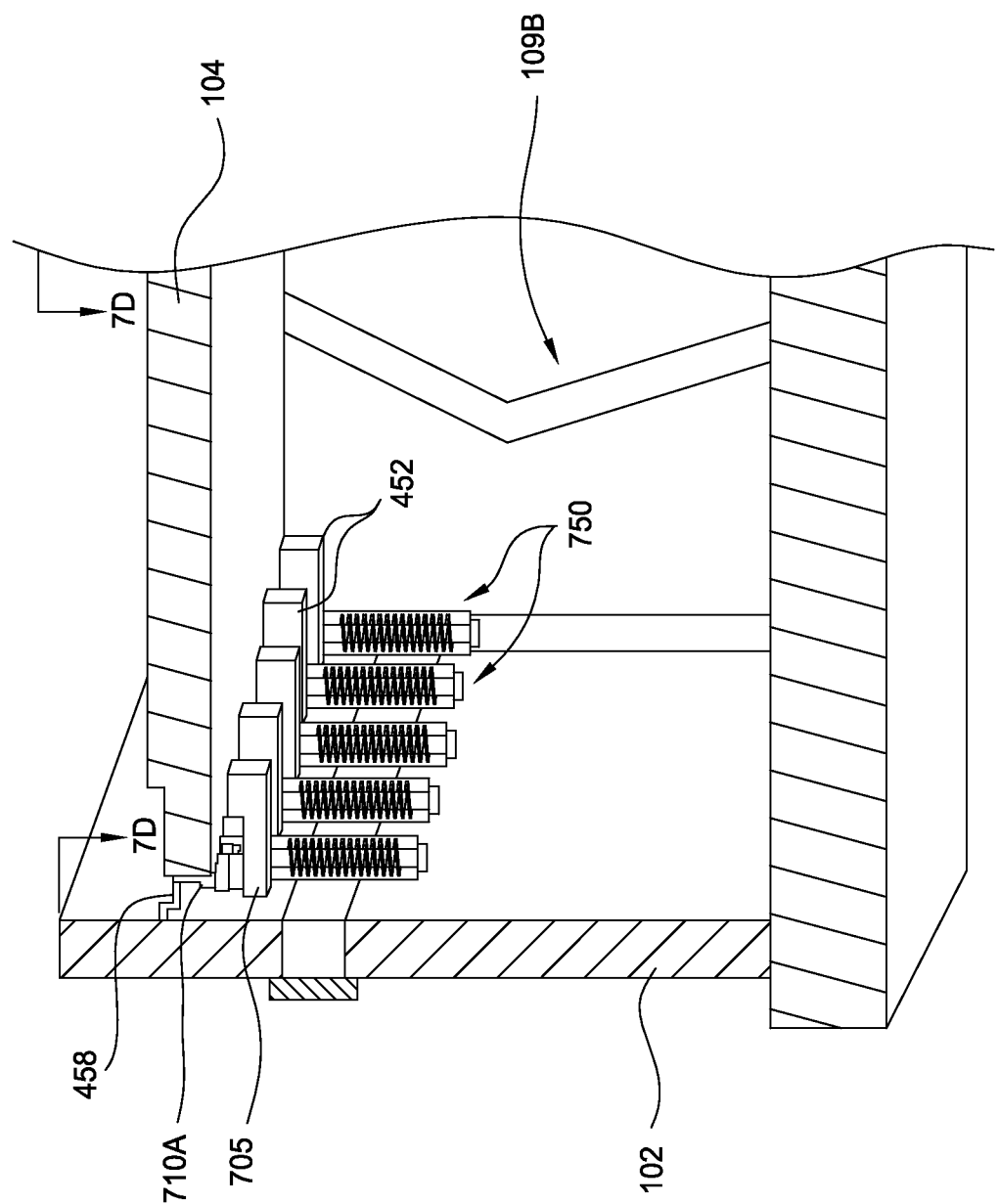
FIG. 7C is an isometric cross-sectional view of one embodiment of coupling arrangement for a plurality of compressible contact members.

FIG. 7C is an isometric cross-sectional view of one embodiment of coupling arrangement for a plurality of compressible contact members 750 as seen from an interior of the chamber body 102. The substrate support 104 is shown in a raised position such that the contact pads 715 (not shown in this view) are in contact with the extended member 458. Each of the compressible contact members 750 are coupled to an individual bracket 452 that are coupled to the substrate support 104. Brackets 452 may be added or removed as desired. Additionally, the bases 705 may be added to or removed from existing brackets 452 as desired.

Figure 7D:
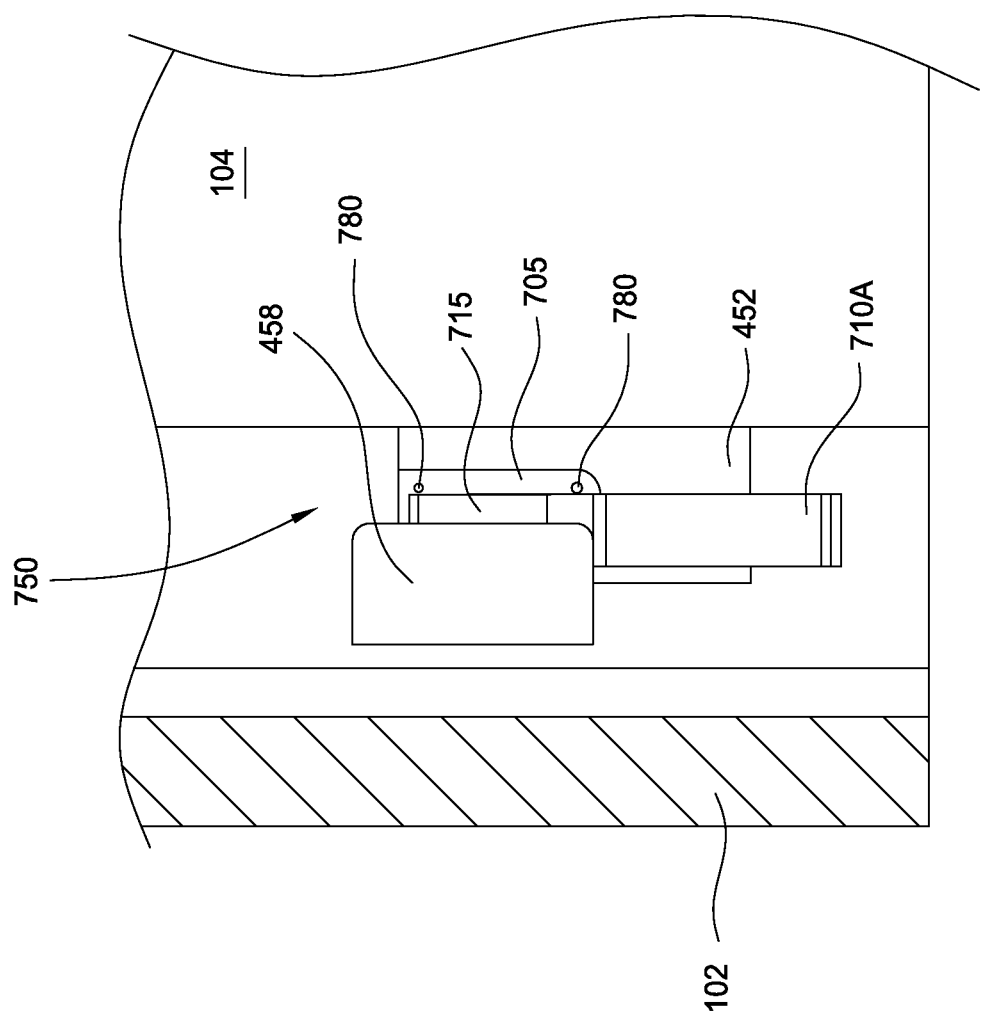
FIG. 7D is a top view of a portion of the chamber body of FIG. 7C taken from line 7D-7D.

FIG. 7D is a top view of a portion of the chamber body 102 taken from line 7D-7D of FIG. 7C. A portion of the contact pad 715 is shown below the extended member 458. It is noted that the compressible contact member 750 is accessible between the side of the chamber body 102 and the substrate support 104. Thus, the compressible contact members 750 may be accessed within the chamber body 102 from a position above the substrate support 104 for maintenance, inspection, replacement or removal by personnel. In one embodiment, two fasteners 780 coupling the base 705 to the bracket 452 may be removed to disengage the base 705 from the bracket 452. Thus, the compressible contact member 750 may be easily removed or replaced by removal or attachment of the two fasteners 780, respectively.

Figure 8A:
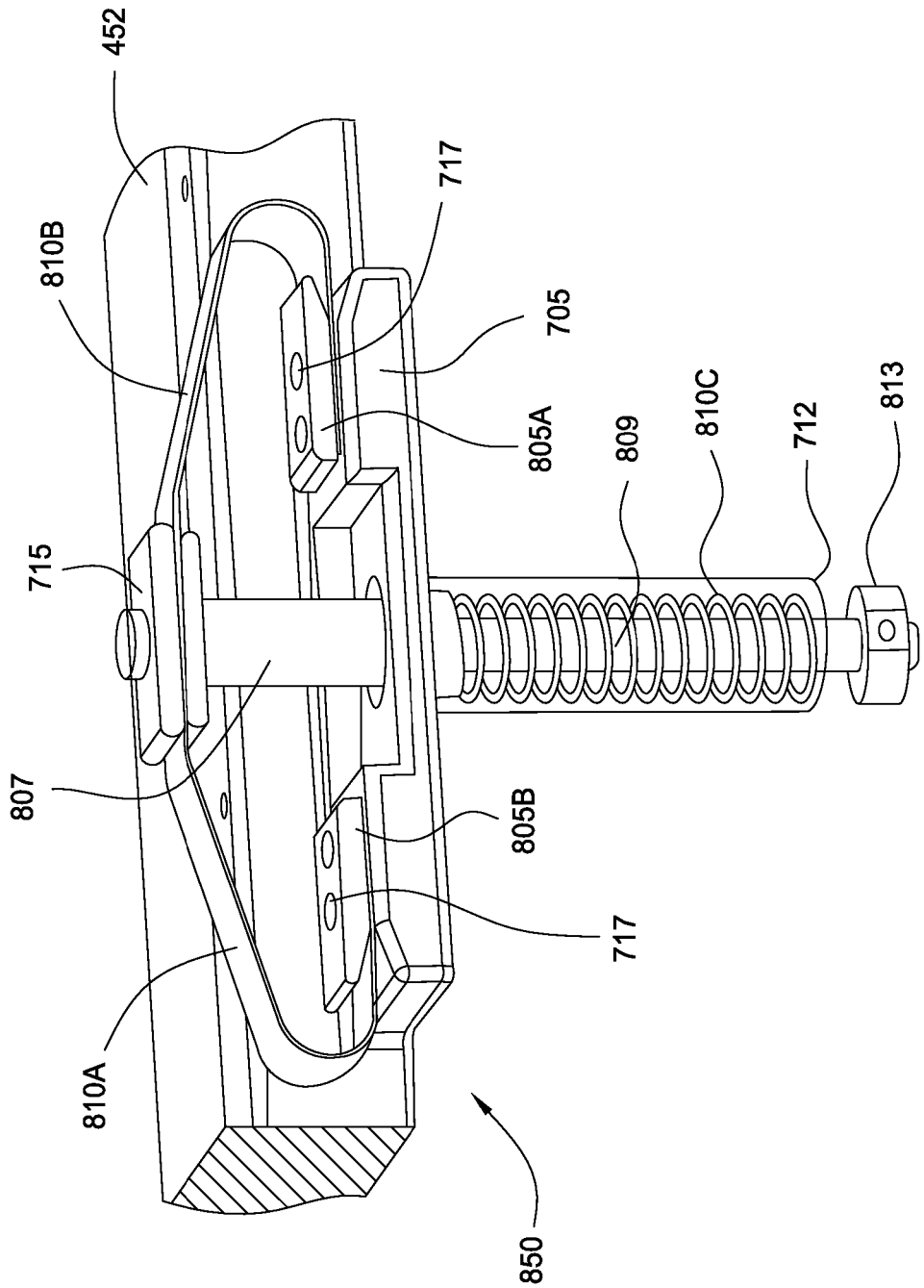
FIG. 8A is an isometric view of another embodiment of a compressible contact member.

FIG. 8A is an isometric view of another embodiment of a compressible contact member 850 coupled to a bracket 452 configured as a bar that is coupled to a substrate support (not shown). In this embodiment, the compressible contact member 850 is similar to the compressible contact member 750 shown in FIGS. 7A-7D with the exception of three spring forms 810A-810C. Spring forms 810A, 810B may be a flexible material made with conductive or insulating materials having properties that carry or conduct an electrical current. In one embodiment, the flexible material includes sheet material, such as sheet metal or foil, a cable or wire, and combinations thereof, or other elastic member or material. The spring forms 810A-810C are exposed to the processing environment in the plasma chambers 100 and 400 as described herein and the flexible materials are chosen to survive and operate in the extremes encountered in the processing environments. In one embodiment, the flexible material for the spring forms 810A, 810B include any metal or metal alloy that substantially retains flexible properties, such as mechanical integrity and/or spring properties, during processing. In one aspect, the flexible material for the spring forms 810A-810C includes any metal or metal alloy that substantially retains flexible properties when the flexible material reaches temperatures above 200 degrees Celsius. In this embodiment, the flexible property of the material retained at the temperature above 200 degrees Celsius is substantially similar to the flexible property of the material at ambient temperature.

In some embodiments, the flexible material for the spring forms 810A and 810B may be in the form of a leaf spring or other flexible device or form. The spring form 810C may be a coil spring, a compression spring or other flexible device or form. In one embodiment, the spring forms 810A-810C comprise a metal material or metallic alloy, which may additionally be coated, wrapped or clad with a conductive material. Examples of metals or metal alloys include nickel, stainless steel, titanium, alloys thereof or combinations thereof, MONEL®, beryllium copper, or other conductive elastic materials. Examples of conductive materials for the coating, wrapping or cladding include aluminum, anodized aluminum, or other coating, film, or sheet material. In one embodiment, the spring forms 810A and 810B comprise a nickel or titanium alloy sheet material that is wrapped or covered with aluminum foil. In one embodiment, the spring form 810C comprises a MONEL® 400 material.

In one embodiment, the spring forms 810A, 810B may be a continuous single sheet material or a single leaf spring having two ends 805A, 805B or may be two separate discontinuous pieces of sheet material or two leaf springs coupled at respective ends at the contact pad 715. In this embodiment, a collar 813 is shown that is coupled to a second shaft 809 disposed within the tubular member 712. The collar 813 may be made of a conductive material, such as aluminum or anodized aluminum. The collar 813 may comprise a nut or include a threaded portion that is adapted to fix to the second shaft 809. The second shaft 809 may be of a reduced dimension, such as a diameter, to allow the spring form 810C to fit thereover.

Figure 8B:
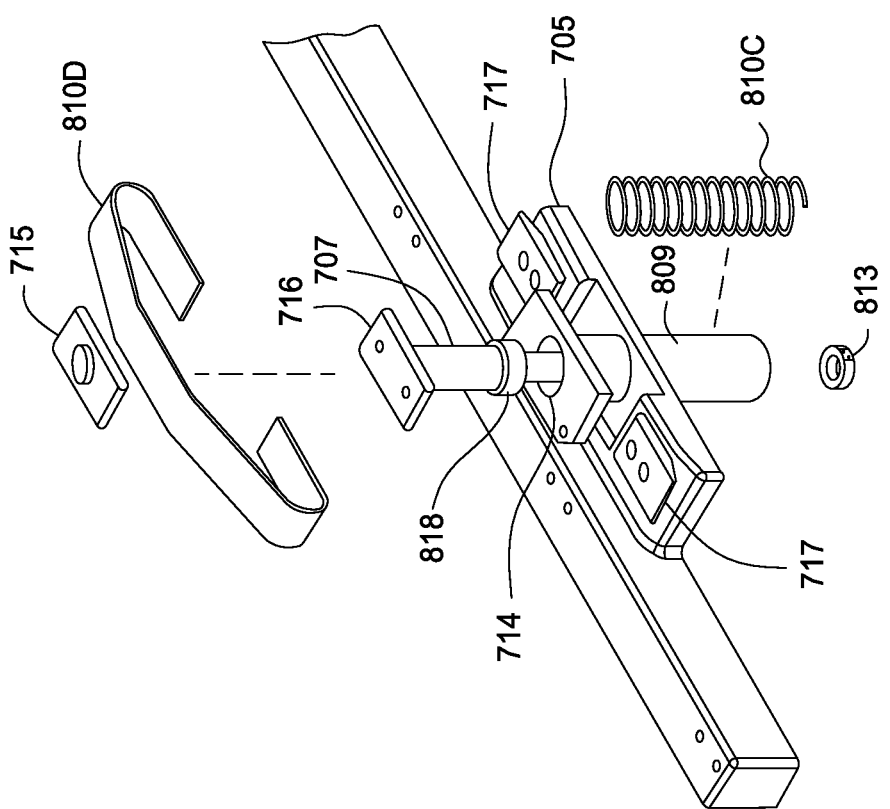
FIG. 8B is an exploded isometric view of the compressible contact member shown in FIG. 8A.

FIG. 8B is an exploded isometric view of the compressible contact member 850 shown in FIG. 8A. In this embodiment, a spring form 810D is a single continuous sheet material or a single leaf spring. The spring form 810D may be fabricated from the same materials described in reference to spring forms 810A and 810B.

FIGS. 8C and 8D are isometric views of one embodiment of a bracket 452 that includes integral bases 805 that may be configured similarly to the base 705 described in FIGS. 7A-8B. In this embodiment, the bracket 452 is configured as an elongated bar that is coupled to the substrate support 104. The bracket 452 also includes empty bases 803 that may be used to couple additional compressible contact members 850, if desired, which enhances the modularity of the compressible contact members.

Figure 9A:
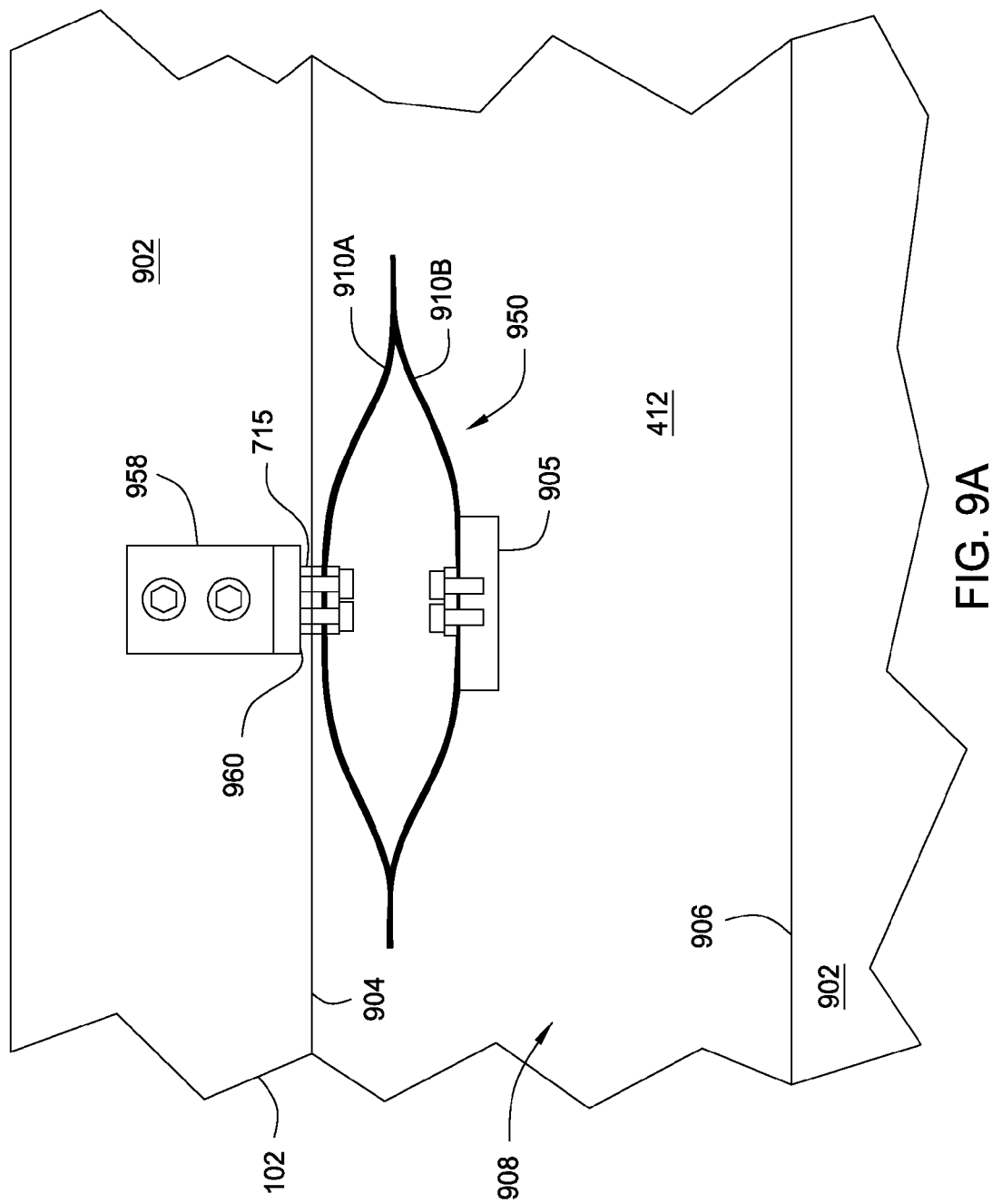
FIG. 9A is a schematic view of another embodiment of a compressible contact member.

FIG. 9A is a schematic view of another embodiment of a compressible contact member 950. In this embodiment, the compressible contact member 950 is shown from an interior portion of the chamber body 102 at the port. From the perspective in the interior of the chamber body 102, the port includes a cut-out portion or tunnel 908 in an interior sidewall 902 that is bounded by an upper portion 904 and a lower portion 906 of the tunnel 908. The compressible contact member 950 includes spring forms 910A, 910B coupled to a contact pad 715 and a base 905. The spring forms 910A, 910B may be made from the same materials described in reference to spring forms 810A and 810B.

The base 905 is coupled to a bracket and/or the substrate support, both of which are not shown in this view for clarity. In the raised position, the contact pad 715 is adapted to contact a contact surface 960 of an extended member 958 that is fixedly coupled to the interior sidewall 902 of the chamber body 102. As the compressible contact member 950 is coupled to the substrate support and is shown in this view in a raised position, the substrate support would obscure the view of the compressible contact member 950 and portions of the extended member 958. When the substrate support is lowered for a substrate transfer operation, the compressible contact member 950 would move with the substrate support 104 such that no portion of the compressible contact member 950 would interfere with the transfer operation at the port.

Figure 9B:
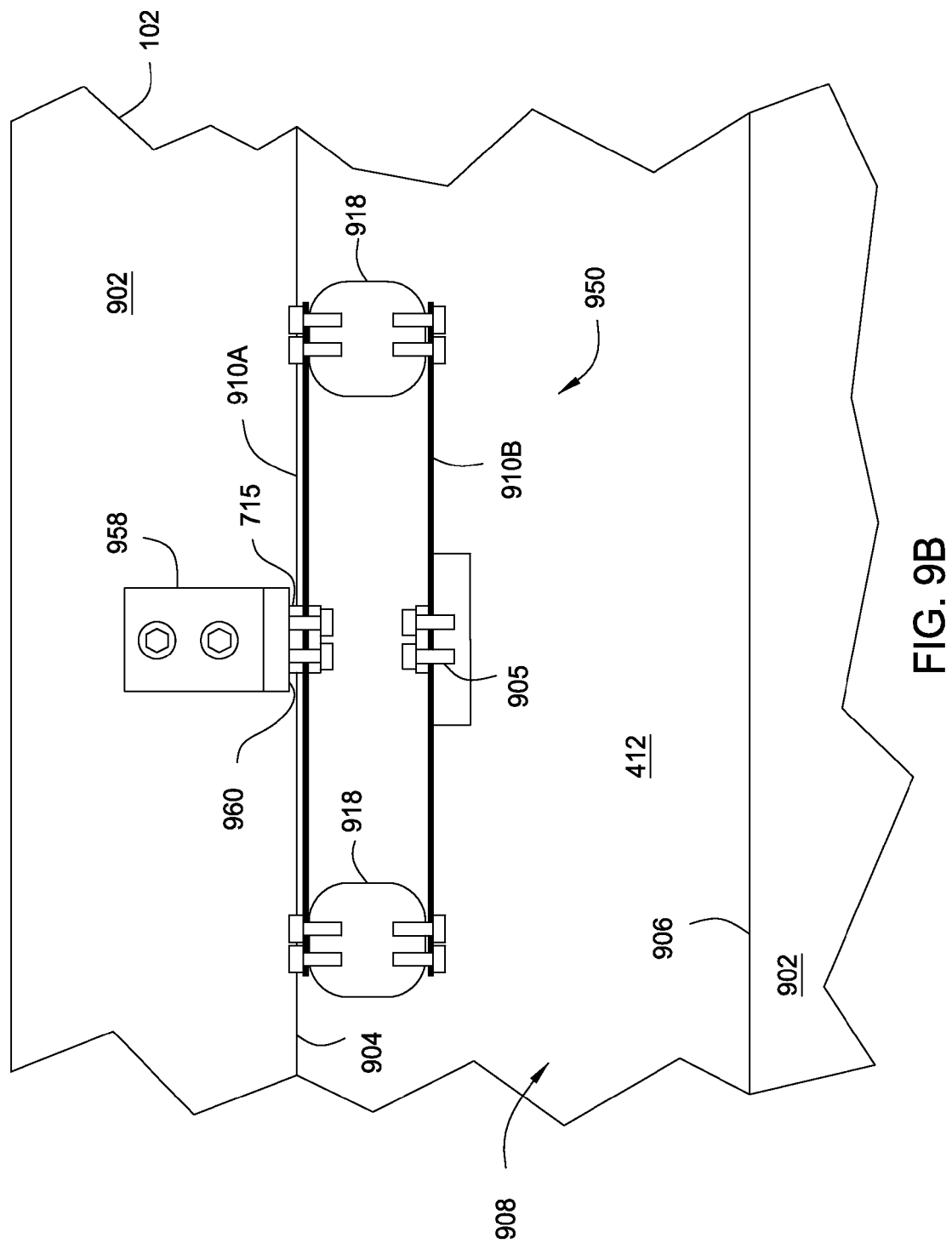
FIG. 9B is a schematic view of another embodiment of a compressible contact member.

FIG. 9B is a schematic view of another embodiment of a compressible contact member 950. The compressible contact member 950 is shown from an interior portion of the chamber body 102 at the port similar to the view of FIG. 9A. The compressible contact member 950 includes spring forms 910A, 910B coupled to a contact pad 715 and a base 705. The base 705 is coupled to a bracket and/or a substrate support, both of which are not shown as the presence of the substrate support would obscure the view of the compressible contact member 950. In this embodiment, the spring forms 910A, 910B are coupled to spacers 918. The spring forms 910A, 910B and spacers 918 comprise a dimension, such as a thickness or width, that allows ample movement of the spring forms 910A, 910B and spacers 918 between the interior sidewall 902 and the substrate support. The spring forms 910A and 910B may be made from the same materials described in reference to spring forms 810A and 810B.

Figure 10A:
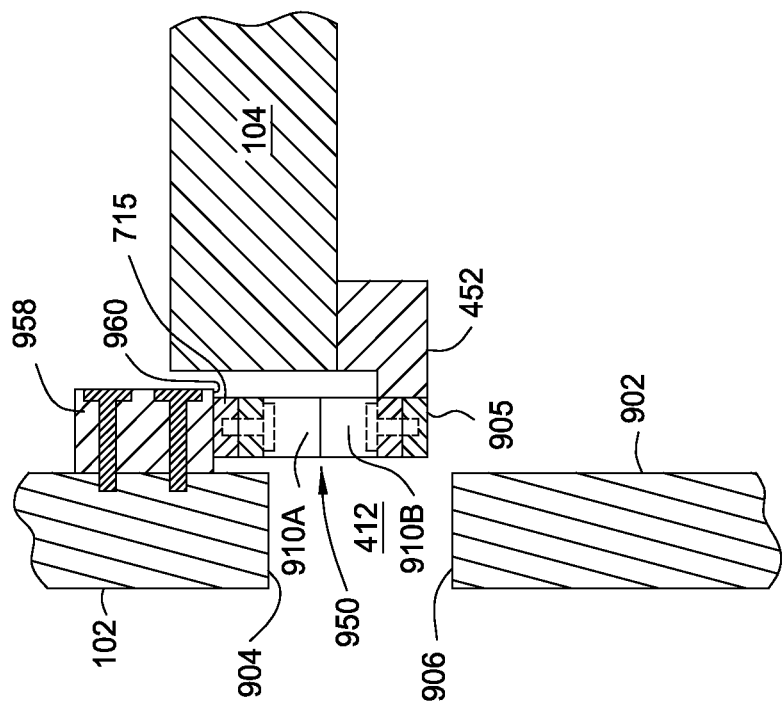
FIGS. 10A and 10B are side cross-sectional views of a portion of the chamber body showing the compressible contact member of FIG. 9A.
Figure 10B:
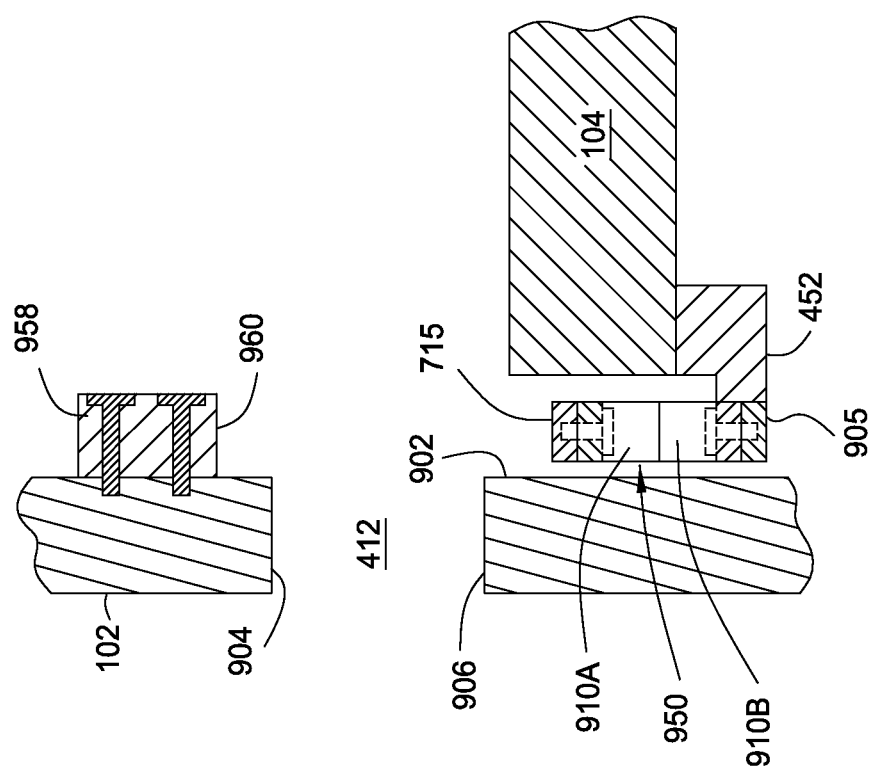

FIGS. 10A and 10B are side cross-sectional views of a portion of the chamber body 102 showing the compressible contact member 950 of FIG. 9A coupled to a substrate support 104. FIG. 10A shows the compressible contact member 950 and the substrate support 104 in a raised position and FIG. 10B shows the compressible contact member 950 and the substrate support 104 in a lowered position. As described above, when the substrate support 104 is in a lowered position, no portion of the compressible contact member 950 is in a position to interfere with the port.

By having an anodized or insulating layer on the edge of the showerhead and not on the remainder of the showerhead, arcing between the showerhead and the chamber walls may be substantially reduced. The anodized or insulating layer may have a thickness that is sufficient to add impedance without cracking the anodized or insulating layer. By reducing arcing, uniformity of deposition thickness as well as film properties across the substrate may be achieved.

While the foregoing is directed to embodiments of the present invention, other and further embodiments of the invention may be devised without departing from the basic scope thereof, and the scope thereof is determined by the claims that follow.

The invention claimed is:

1. A gas distribution showerhead, comprising:
a showerhead body having a plurality of gas passages extending therethrough, wherein the plurality of gas passages extend from a first surface of the showerhead body to a second surface of the showerhead body, and wherein the second surface of the showerhead body comprises:
 a central portion, wherein no anodized coating is disposed on the central portion; and
 an outer portion, wherein an anodized coating is disposed on at least part of the outer portion.

2. The gas distribution showerhead of claim 1,
wherein the outer portion of the second surface of the showerhead body further comprises a first flange portion, wherein the first flange portion comprises:
a first surface;
a second surface opposite the first surface and coextensive with the second surface of the showerhead body;
an edge surface connecting the first and second surfaces of the first flange portion;
wherein the anodized coating covers at least part of the edge surface;
wherein the anodized coating covers the first surface of the first flange portion from the edge surface to a first distance from the edge surface; and
wherein the anodized coating covers the second surface of the first flange portion from the edge surface to a second distance from the edge surface, wherein the second distance is greater than the first distance.

3. The gas distribution showerhead of claim 1, wherein the showerhead body comprises aluminum.

4. The gas distribution showerhead of claim 3, wherein the anodized coating comprises a material selected from the group consisting of $Al_2O_3$, $SiO_2$, polytetrafluoroethylene and combinations thereof.

5. The gas distribution showerhead of claim 4, wherein the anodized coating has a thickness between about 50 microns and about 63 microns.

6. The gas distribution showerhead of claim 1, wherein the anodized coating comprises a material selected from the group consisting of $Al_2O_3$, $SiO_2$, polytetrafluoroethylene and combinations thereof.

7. The gas distribution showerhead of claim 6, wherein the anodized coating has a thickness between about 50 microns and about 63 microns.

8. A plasma processing apparatus, comprising:
a processing chamber body having one or more walls and a floor;
a susceptor disposed in the processing chamber body and movable between a first position and a second position;
one or more straps, wherein at least one strap is coupled on one end to the susceptor and on another end to the floor or at least one of the one or more walls;
a showerhead body disposed in the processing chamber body opposite to the susceptor and having one or more gas passages extending therethrough, the showerhead body comprising:
 a first surface facing away from the susceptor;
 a second surface facing the susceptor, the second surface comprising portions adjacent to the walls and a central portion; and an anodized coating disposed over portions of the second surface that are adjacent to the walls and wherein no anodized coating is disposed on the central portion; and a bracket coupled to the flange, wherein the bracket is separate and distinct from the anodized coating; and a shadow frame disposed in the processing chamber body between the susceptor and the showerhead, the shadow frame movable between a third position spaced from the susceptor and a fourth position in contact with the susceptor.

9. The apparatus of claim 8, wherein the shadow frame comprises a ceramic material.

10. The apparatus of claim 9, wherein the shadow frame comprises $Al_2O_3$.

11. The apparatus of claim 8, wherein the anodized coating comprises a material selected from the group consisting of $Al_2O_3$, $SiO_2$, polytetrafluoroethylene and combinations thereof.

12. The apparatus of claim 11, wherein the showerhead body comprises aluminum.

13. The apparatus of claim 8, wherein the anodized coating has a thickness between about 50 microns and about 63 microns.

14. The apparatus of claim 8, wherein the straps are symmetrically disposed along a first axis and asymmetrically disposed along a second axis perpendicular to the first axis.

15. A plasma enhanced chemical vapor deposition apparatus, comprising:

a chamber body having a plurality of walls and a chamber floor;

a susceptor disposed in the chamber body and movable between a first position spaced a first distance from the chamber floor and a second position spaced a second distance greater than the first distance from the chamber floor;

a plurality of straps, wherein at least one strap is coupled on one end to the susceptor and on another end to the chamber floor or at least one of the plurality of walls, and wherein the plurality of straps are unevenly distributed along the susceptor;

a gas distribution showerhead body disposed in the chamber body opposite the susceptor, the gas distribution showerhead body having:
    a plurality of gas passages extending therethrough;
    a first surface facing away from the susceptor;
    a second surface facing the susceptor and having a central portion and an edge portion;
    a flange extending from the showerhead body, wherein the flange has a surface coextensive with the first surface of the showerhead body, and wherein the flange has a third surface opposite the first surface and distinct from the second surface; and wherein the second surface of the gas distribution showerhead body has an anodized coating disposed over less than the entire second surface of the gas distribution showerhead body, the anodized coating extending above the second surface of the gas distribution showerhead body, the anodized coating having a thickness over the edge portion that is greater than a thickness over the central portion; and a bracket coupled to the flange of the gas distribution showerhead body, wherein the bracket is separate and distinct from the anodized coating.

16. The apparatus of claim 15, further comprising a shadow frame disposed between the gas distribution showerhead body and the susceptor.

17. The apparatus of claim 16, wherein the shadow frame comprises a ceramic material.

18. The apparatus of claim 17, wherein the shadow frame comprises $Al_2O_3$.

19. The apparatus of claim 15, wherein the anodized coating comprises a material selected from the group consisting of $Al_2O_3$, $SiO_2$, polytetrafluoroethylene and combinations thereof.

20. The apparatus of claim 19, wherein the showerhead body comprises aluminum.

21. The apparatus of claim 15, wherein the anodized coating has a thickness between about 50 microns and about 63 microns.

22. The apparatus of claim 15, wherein the straps are symmetrically disposed along a first axis and asymmetrically disposed along a second axis perpendicular to the first axis.

23. The gas distribution showerhead of claim 2, wherein the outer portion of the showerhead body further comprises a second flange portion, wherein the second flange portion comprises:
    a first surface coextensive with the first surface of the showerhead body;
    a second surface opposite the first surface of the second flange portion; and
an edge surface connecting the first surface of the second flange portion and the second surface of the second flange portion.

* * * * *